United States Patent [19]

Carlson

[11] Patent Number: 4,889,961
[45] Date of Patent: Dec. 26, 1989

[54] GRAPHITE TRACE ELECTRICAL INTERCONNECT

[75] Inventor: Jerrold L. Carlson, Waseca, Minn.

[73] Assignee: E. F. Johnson Company, Waseca, Minn.

[21] Appl. No.: 230,564

[22] Filed: Aug. 10, 1988

[51] Int. Cl.[4] .......................... H05K 1/00; H05K 3/00
[52] U.S. Cl. ........................................ 29/846; 29/846
[58] Field of Search .............. 174/68.5; 434/224, 301; 273/1 GA; 29/846

[56] References Cited

U.S. PATENT DOCUMENTS

| | | | |
|---|---|---|---|
| 2,066,511 | 1/1937 | Arlt | 174/68.5 |
| 2,265,419 | 12/1941 | Brand et al. | 106/20 |
| 2,636,920 | 4/1953 | Lockery et al. | 174/68.5 |
| 3,077,511 | 2/1963 | Bohrer et al. | 174/68.5 |
| 3,541,706 | 11/1970 | Shapiro | 434/117 |
| 3,705,047 | 5/1972 | Marriott | 174/68.5 X |
| 4,288,537 | 9/1981 | Knetzger | 434/169 |
| 4,496,607 | 1/1985 | Mathias | 427/96 X |
| 4,641,425 | 2/1987 | Dubuisson et al. | 174/68.5 X |
| 4,706,167 | 11/1987 | Sullivan | 174/68.5 X |
| 4,743,710 | 5/1988 | Shieber et al. | 174/68.5 |
| 4,764,644 | 8/1988 | Reisman et al. | 174/68.5 |

OTHER PUBLICATIONS

Feulner, R. A., "Circuit Repair and Fabrication"; IBM Technical Disclsoure Bulletin; vol. 9, No. 10; Mar. 1967; p. 1309.

Greenwood, R. W.; "Silver Bearing Conductive Pastes"; IBM Technical Disclosure Bulletin; vol. 17, No. 2; Jul. 1974; p. 437.

*Primary Examiner*—Morris H. Nimmo
*Attorney, Agent, or Firm*—Dorsey & Whitney

[57] ABSTRACT

An electrical interconnect or switch device for interconnecting electrical and electronic elements on a printed circuit board uses a carbon/graphite trace is used to connect electrical contact pads on a ceramic or similar substrate. The substrate surface has a plurality of electrically conductive contact pads and a plurality of isolation regions defined on the substrate surface such that each of the contact pads is separated from the remaining contact pads by at least one of the isolation regions. Each of the contact pads may be electrically connected to one or more of the circuit elements on the printed circuit board and a trace means, preferably a carbon/graphite pencil lead, is used to selectively electrically interconnect two or more of the contact pads by tracing between the selected contact pads across at least one of said isolation regions, thereby electrically interconnecting the circuit elements associated with the selected contact pads. The switch has particular application for three different types of physical devices: a dual in-line package (DIP) switch configuration, a surface mount configuration, and a configuration where the electrical interconnect is established directly on the substrate surface of the printed circuit board.

39 Claims, 2 Drawing Sheets

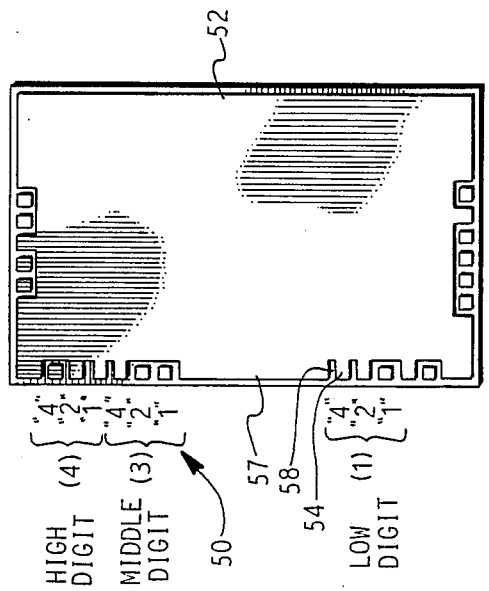
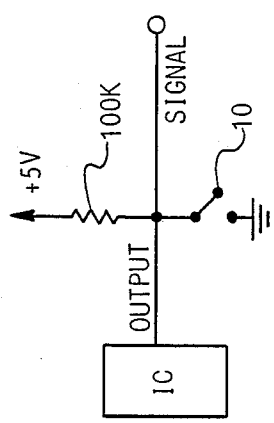
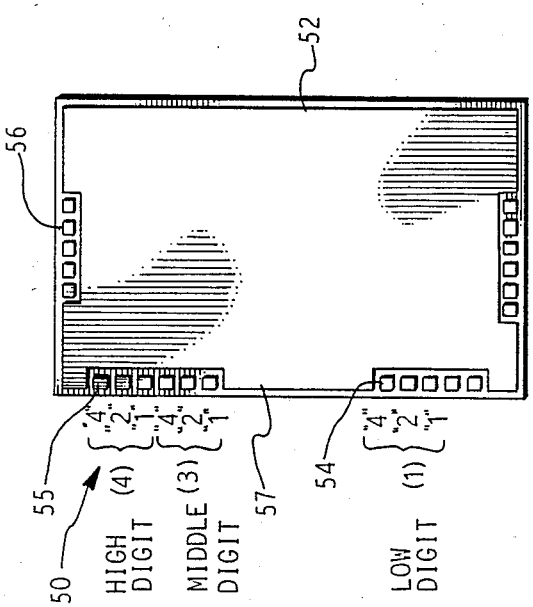
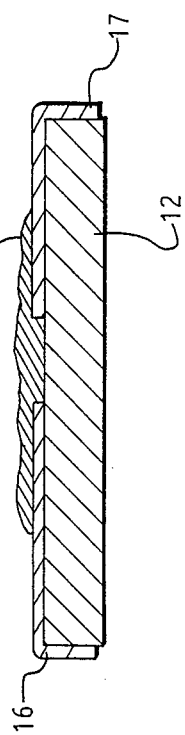

GRAPHITE TRACE ELECTRICAL INTERCONNECT

TECHNICAL FIELD

The present invention relates generally to the field of electrical interconnections and, more particularly, the present invention relates to a novel method and device for interconnecting electrical and electronic elements on a printed circuit board by the use of a carbon/graphite trace interconnect.

BACKGROUND ART

The vast majority of printed circuit boards manufactured today contain one or more discrete electrical interconnects or switches that are used to program or configure the desired operation of a particular component or circuit on the printed circuit board. Currently, such switches are implemented by the use of conventional electro-mechanical dual in-line package ("DIP") switches or jumper wires that selectably interconnect two electrical contacts on a printed circuit board. Because a discrete switch must provide some type of electro-mechanical interface to allow access to the switch element, DIP switches and jumper wires tend to be taller and take up more surface area that most other circuit components. In addition, the mechanical nature of such a switch limits the possible switch settings to primarily a single-pole (on/off) configuration. Mechanical switches are also more prone to failure, particularly with repeated reprogramming of the switch. Finally, each DIP switch or jumper wire is an additional element that must be mounted on the printed circuit board during assembly of the board.

Although such electrical interconnects or switches may be satisfactory for various uses and applications, it would be desirable to implement a discrete switch on a printed circuit board without the need for a DIP switch or jumper wire, particularly in those situations where vertical clearance or footprint space on the board is limited or when the switch will be reconfigured a number of times during the life of the product. Accordingly, there is a continuing need for an inexpensive, efficient and adaptable means for implementing a discrete switch element or electrical interconnect on a printed circuit board.

SUMMARY OF THE INVENTION

In accordance with the present invention a method and device for interconnecting electrical and electronic elements on a printed circuit board is disclosed whereby a carbon/graphite trace is used to connect electrical contact pads on a ceramic or similar substrate.

The electrical interconnect or switch device provides for an electrical interconnection among circuit elements on a printed circuit board by using a substrate surface having a plurality of electrically conductive contact pads and a plurality of isolation regions defined on the substrate surface such that each of the contact pads is separated from the remaining contact pads by at least one of the isolation regions. Each of the contact pads may be electrically connected to one or more of the circuit elements on the printed circuit board and a trace means, preferably a carbon/graphite pencil lead, is used to selectively electrically interconnect two or more of the contact pads by tracing between the selected contact pads across at least one of said isolation regions, thereby electrically interconnecting the circuit elements associated with the selected contact pads.

The electrical interconnect or switch device of the present invention has particular application for three different types of physical devices: a dual in-line package (DIP) switch configuration, a surface mount configuration, and a configuration where the electrical interconnect is established directly on the substrate surface of the printed circuit board.

Accordingly, a primary objective of the present invention is to provide an inexpensive, efficient and adaptable means for implementing an electrical interconnect or discrete switch on a printed circuit board.

Another objective of the present invention is to provide a low profile, reprogrammable switch for use on printed board where vertical clearance is limited.

A further objective of the present invention is to provide an inexpensive multi-contact or programmable switch for use on a printed circuit board.

These and other objectives of the present invention will become apparent with reference to the drawings, the detailed description of the preferred embodiment and the appended claims.

DESCRIPTION OF THE DRAWINGS

FIG. 5 is a schematic diagram of a typical electronic application of the switch device of the present invention.

FIG. 6 is a pictorial representation of a circuit board version of the present invention.

FIG. 7 is the same view as shown in FIG. 6 only showing selected isolation regions filled in with electrical interconnects to selectively program the circuitry on the top side of the circuit board.

FIG. 8 is a cut-away cross-sectional view along lines 1—1 of FIG. 1.

DESCRIPTION OF THE PREFERRED EMBODIMENT

Figure 1:
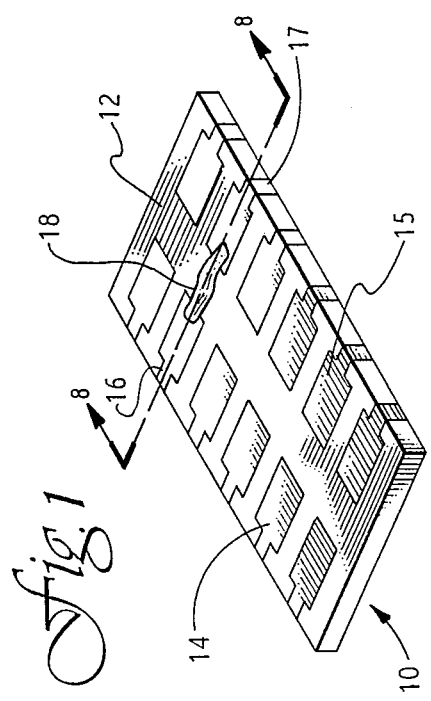
FIG. 1 is a pictorial representation of a surface mount version of the present invention.

Referring to FIG. 1, a switch device 10 in accordance with the present invention generally includes a substrate 12 and a plurality of contact pads 14, 15, 16, and 17. The contact pads may be selectably interconnected to form an electrically conductive path by using a standard pencil to draw a carbon/graphite pencil lead trace between any of the contact pads. A typical trace 18 is shown between contact pads 16 and 17. Reprogramming of switch device 10 is accomplished by simply erasing the carbon/graphite trace 18 using an ordinary pencil eraser. Once the previous trace has been removed, a new trace can then be reprogrammed between the desired contact pads.

The carbon/graphite trace 18 is created by filling in the area of substrate 12 between two or more pads 14, 15, 16 and 17 with a carbon/graphite lead pencil. Generally, a No. 2 lead pencil may be used to create trace 18; however, any instrument capable of depositing a carbon/graphite trace in the area between any two pads sufficient to maintain an electrically conductive connection may be used. Other substances might also be used in a tracing instrument to deposite the conductive traces, including lead, gold, silver, or any other malleable or graphite-like conductive material so long as the combination of surface structure and trace material is capable of creating an adequate electrical interconnection between the contact pads that may be simply and easily removed to reprogram the switch device. While no particular requirements are necessary for obtaining a trace that establishes an adequate interconnection between connector pads, better connections (as measured in terms of uniformly low resistivity) are created when the trace is made by drawing or filling in the area between the two contact pads in a circular manner.

The ability of a carbon/graphite trace 18 to establish an adequate electrical interconnection between pads 16 and 17 may be explained by the relationship betwen the trace medium and the porosity and surface structure of the substrate surface. By depositing a thin layer of conductive carbon/graphite on the surface of an object, for instance by using a pencil lead to trace a line between two contact pads, that line may create a conductive path on the surface of the object. The resistivity of the line will be a function of the type of pencil lead used, the density of the deposited lead, and the surface structure of the object. If a very hard pencil lead is used, for example a No. 6 Lead, on a very smooth and non-porous surface, for example glass, the amount of conductive material deposited by the trace would be insufficient to create an adequate electrical interconnection between any two points on that surface. However, when the trace is made with a relatively soft pencil, for example a No. 2 Lead, on a relatively porous or somewhat rough surface, for example a ceramic surface, an adequate electrical interconnection (in the range of 100–1,000 ohms) can be created over short distances on such a surface. It is believed that the electrical interconnection is due to the fact that pencil lead is deposited in a sufficient and continuous quantity in the microscopic variations on the surface of the substrate material to create an effective electrical connection.

Figure 2:
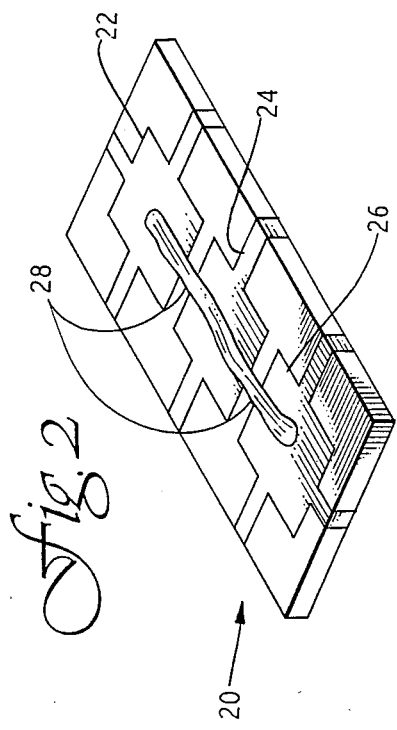
FIG. 2 is a pictorial representation of a multi-connection surface mount verision of the present invention.

Because pads 14, 15, 16 and 17 on switch device 10 may be arranged in almost any pattern desired, multi-connection or multiple pole switches or even programmable array configurations can be implemented using a single device. One example of such a multi-connection switch device 20 is shown in FIG. 2. Contact pads 22, 24 and 26 are each connected to various circuit leads, respectively. By connecting contact pads 22, 24, and 26 with trace 28, all of the respective circuit leads are thereby connected together forming a multi-lead connection. In another embodiment shown in FIG. 3, switch device 30 is presented in a conventional DIP format having a single contact pad 32 on on side and a plurality of contact pads 33, 34 and 35 on the other side of switch device 30. By connecting contact pad 32 with contact pad 35, trace 36 performs a switching function similar to a conventional multi-pole switch. Multi-pole configurations or multi-connection switch configurations may also be used for analog applications or tri-state digital applications.

Figure 3:
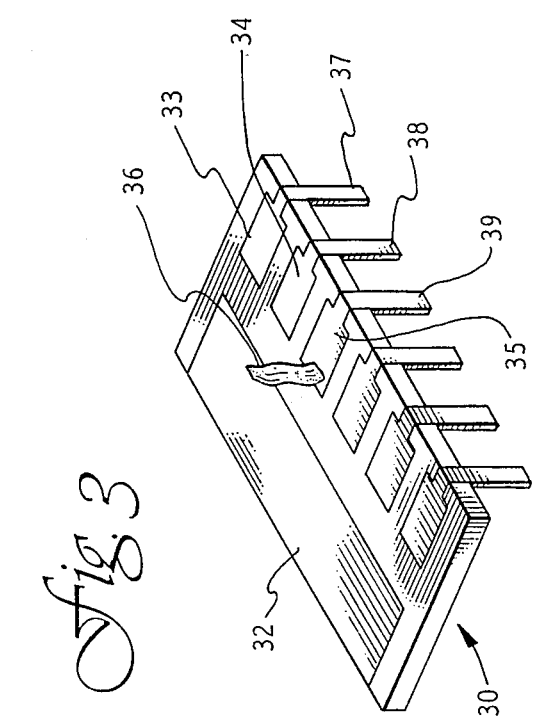
FIG. 3 is a pictorial representation of a dual in-line package version of the present invention.

In the embodiment shown in FIG. 3, surface mounting pins 37, 38 and 39 are attached to connector pads 33, 34 and 35, respectively. Pins 37, 38 and 39 allow switch device 30 to be handled and mounted like a standard dual in-line package element. Because switch device 30 may be mounted and soldered onto a printed circuit board using the same techniques and equipment as currently used for mounting conventional integrated circuit chips, the time and expense associated with mounting a conventional DIP switch is reduced.

Figure 4:
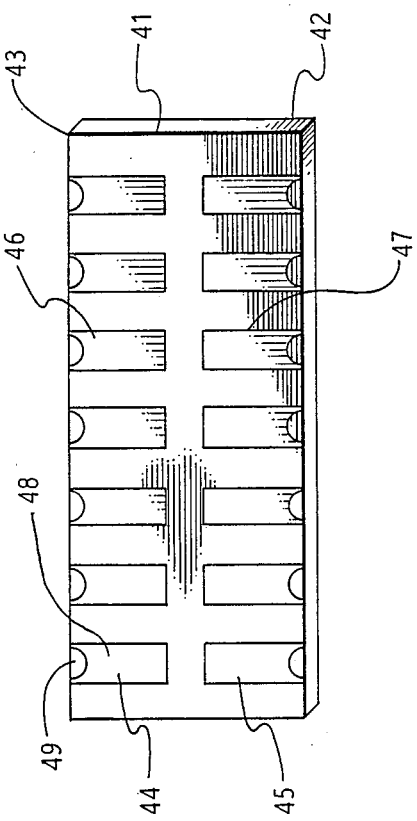
FIG. 4 is the top view of a surface mount version of the present invention.

In another alternative embodiment shown in FIG. 4, the switch device 40 consists of a ceramic substrate 41 with palladium silver plated on an upper surface 43 of substrate 42 to form conductive islands or conductive pads 44, 45, 46 and 47. In this embodiment, it will be seen that an extension 48 of pad 44 is carried to the edge 49 of upper surface 43 where the extension 48 is connected with a plated half hole 49. The plated half hole 49 provides conductivity to the bottom surface 42 of ceramic substrate 41 and also aids in soldering switch device 40 onto a printed circuit board (not shown). Mounting of switch device 40 on a printed circuit board is accomplished in a manner similar to mounting a conventional leadless chip carrier (LCC) on a printed circuit board, a method well known in the art.

It will be apparent that switch device 10 may be used in any situation where a conventional DIP switch or jumper wire is used to program or configure circuits on a printed circuit board. As shown in FIG. 3, the switch device 30 when configured in a DIP format is substantially shorter and occupies a smaller footprint than a comparable DIP switch. Unlike a conventional DIP switch or jumper wire, switch device 10 is not limited to a single pole or simple on/off configuration and may be arranged in a wide variety of configurations. Additionally, programming or reprogramming of switch device 10 does not require that an element, a jumper wire for instance, be soldered or unsoldered from the printed circuit board.

Because the switch device 10 of the present invention can be used to create repeatable electrical interconnections having resistance values in the range of 100–1,000 Ohms, these interconnects are easily adaptable as switch devices in current integrated circuit applications. Typical resistances for input/output gates on integrated circuits range from 500K–1M Ohms and typical gate currents range from 0.001–0.3 microamps. Such resistances and current levels do not affect the design choices for using the switch device 10 of the present invention in a typical integrated circuit application. Referring to FIG. 5, a schematic diagram for a typical pull-up output of an integrated circuit chip is shown. If the switch device 10 is used as the switching device in this circuit, the net effect of closing the switch 10 by filling in a carbon/graphite electrical trace 18 is to place a resistance of approximately 200 ohms in parallel with a 100K ohm resistance, thereby overriding the 100K pull-up resistor and shorting that signal to ground.

In another embodiment shown in FIG. 6, the need for a separate switch element is eliminated altogether by incorporating switch device 50 onto one of the surfaces of printed circuit board 52. Contact pads 54, 55, and 56 are formed on the same surface as ground plane 57. As shown in FIG. 7, a trace 58 interconnects contact pad 54 switch ground plane 57, thereby shorting the circuit element (not shown) associated with contact pad 54. This particular embodiment is especially advantageous for circuit boards designed to be initially programmed or set by grounding or not grounding certain circuit leads. Because no additional switch elements are needed to implement this initial circuit programming, material and assembly costs are reduced. Additionally, since the switching function is implemented on the ground plane side of the circuit board, usable surface area is conserved. It will be obvious that alternative versions of this embodiment may be generated by varying the shape and arrangement of the contact pads. For example, contact pads 54, 55 or 56 could be connected to a voltage "high" level with trace 58, instead of to a ground plane, or contact pads 54, 55 or 56 could be connected to another contact pad 57 to interconnect two circuit elements corresponding to each contact pad.

While there are numerous possible applications for the invention, one application is the use of the electrical interconnects to program coded information that may be used, for example, to prevent a radio transceiver from unsquelching unless the correct tone or digital code as encoded by the graphite electrical interconnects is received with a radio message. Such a system allows multiple transceivers to operate on the same channel with individual users only receiving messages coded with the correct tone as set by the electrical interconnect on their transceiver. FIGS. 6 and 7 show a preferred method of implementing this feature on a circuit board 52 for a transceiver. The programming pads 54, 55 and 56 are located on the opposite component side of the ceramic substrate and connected to the corresponding circuit element on the component side with a plated through-hole (not shown). The coded information is programmed using a standard No. 2 carbon/graphite pencil to deposit carbon between the pad 54 and adjacent ground plane 57. This effectively ground the pad 54. If a programming mistake is made or if the programming is changes, a nonabrasive rubber or vinyl eraser is used to remove the carbon from the ceramic surface. In the embodiment shown in FIG. 5, a nine bit, 3 digit octal code is used to program the code. The initial state of the circuit board 52 is such that all pads are ungrounded which program each pad as a logic "1" because a pull-up resistor is connected to each pad. The result is a code of octal "777". A logic "0" may be programmed by using a pencil to blacken or fill-in the area between the pad and the adjacent ground plan. FIG. 7 shows the same circuit card programed for an octal "431" by shorting the appropriate bits in the octal code.

Though not meant to limit the scope of the invention, the following experimental results are provided to demonstrate the types of electrical interconnections that may be achieved by use of the present invention. Referring to FIG. 8, a cut-away of a switch device 10 in accordance with the present invention is shown having a ceramic substrate surface and contact pads of palladium silver. During repeated reprogramming of the switch device 10, an average resistance of 166.14 Ohms was measured across rectangular pads 16 and 17 when connected by a carbon/graphite trace 66. The width of pads 62 and 64 is 0.075 mils and the gap distance between pads 62 and 64 is 0.025 mils. The trace 18 was created by writing on the ceramic substrate in a circular manner using a No. 2 Lead pencil until a uniform density mark was achieved. A similar test was conducted with the distance between the similar shaped pads over a varying range of gap distances between the pads. The range of average resistances measured over one hundred trials is shown as follows:

TABLE 1

| VARYING GAP DISTANCES (Virgin Ceramic with Palladium Silver) | |
| --- | --- |
| Gap Spacing (mils) | Measured Resistance (Ohms) |
| .010 | 64.6 |
| .020 | 180.9 |
| .030 | 279.9 |

TABLE 1-continued

| VARYING GAP DISTANCES (Virgin Ceramic with Palladium Silver) | |
| --- | --- |
| Gap Spacing (mils) | Measured Resistance (Ohms) |
| .040 | 344.0 |
| .050 | 429.0 |
| .060 | 494.9 |
| .070 | 620.1 |
| .080 | 736.3 |
| .090 | 800.0 |
| .100 | 894.1 |

Next, the same measurements were taken for varying conductive materials (Palladium Silver or Silver 8710 Ag) and contact pad shapes (rectangular or round) at a distance of 0.050 mils on a ceramic substrate for the repeated application of a No. 2 pencil lead to connect the two contact pads. In this case, the each connection trace was made in the manner described above and then erased so that the trace was no longer visible before the next trace was connected. The measured resistances ranged from 200–1,000 ohms. The average resistances measured for a sample of one hundred trials is shown as follows:

TABLE 2

| REPEATED APPLICATIONS (Ceramic Substrate with .050 mil gap) | | |
| --- | --- | --- |
| Conductor | Application | Measured Resistance (Ohms) |
| Palladium Silver rectangular | First | 486.0 |
| | Second | 373.3 |
| | Third | 371.9 |
| Silver (8710 Ag) rectangular | First | 443.2 |
| | Second | 514.2 |
| | Third | 428.2 |
| Palladium Silver round | First | 407.0 |
| | Second | 464.3 |
| | Third | 420.9 |
| Silver (8710 Ag) rectangular | First | 443.1 |
| | Second | 519.0 |
| | Third | 431.3 |

It can be seen from these two tables that the gap spacing between the contact pads will affect the average resistance of the electrical connection between the contact pads in a generally linear manner with greater gap spacings having larger resistance values. There is also an observed relationship between number of applications and the average measured resistance such that repeated applications after the second application will generally have a smaller and more consistent average resistance.

While the preferred embodiment of the invention has been described in terms of a palladium silver conductor deposited on a ceramic substrate, other combinations of conductor and substrate would also be effective in creating a switch device in accordance with the present invention. For example, certain types of roughened fiberglass substrates may be used in place of a ceramic substrate, so long as the porosity of the surface of the substrate will accept enough carbon/graphite to create an adequate electrical interconnection. However, any type of glazed or finished surface on the fiberglass will not work as an the amount of conductive material deposited on such a surface is not sufficient to maintain an effective electrical interconnect. Similarly, a copper-based material may be used in place of palladium silver for the contact pads. Likewise, an aluminum-based conductive material might be used to form the contact pads, provided the oxidized aluminum did not prevent an adequate electrical connection from being formed between the carbon/graphite material and the contact pads. For example, the carbon/graphite material might create an electrical connection with an aluminum-based conductor by first erasing the oxidized aluminum from the surface of the contact pad before drawing the carbon/graphite connection between two or more connectors.

Although the description of the preferred embodiments of the present invention has been quite specific, it is contemplated that various changes could be made without deviating from the spirit of the present invention. Accordingly, it is intended that the scope fo the present invention be dictated by the appended claims rather than by the description of the preferred embodiment.

I claim:

1. A switch device for providing an electrical interconnection among circuit elements on a printed circuit board, comprising:
    a substrate surface on the printed circuit board;
    a plurality of electrically conductive contact pads located on the substrate surface;
    a plurality of isolation regions defined on the substrate surface such that each of the contact pads is separated from the remaining contact pads by at least one of the isolation regions;
    means for electrically connecting each of the contact pads to one or more of the circuit elements on the printed circuit board; and
    erasable graphite trace means for repeatedly and selectively electrically interconnecting two or more of the contact pads by tracing between the selected contact pads across at least one of said isolation regions after the printed circuit board has been manufactured to provide a consistent and sustainable electrical interconnection of the circuit elements associated with the selected contact pads, such that the erasable graphite trace means may also be repeatedly and selectively removed from between the selected contact pads to disconnect the circuit elements associated with the selected contact pads to allow the circuit elements to be quickly and easily reprogrammed.

2. The switch device of claim 1 wherein the substrate surface is a ceramic material.

3. The switch device of claim 1 wherein the conductive pads are palladium silver.

4. The switch device of claim 1 wherein the conductive pads are silver.

5. The switch device of claim 1 wherein the trace is deposited by a carbon/graphite pencil.

6. The switch device of claim 1 wherein the distance across an isolation region between two contact pads selectively electrically interconnected by the erasable graphite trace means is greater than 0.005 mils and less than 0.500 mils and the average resistance between the two contact pads is greater than 50 ohms and less than 1,000 ohms.

7. A dual in-line package switch device for providing an electrical interconnection among circuit elements on a printed circuit board, comprising:
    a generally rectangular substrate;
    a plurality of electrically conductive contact pads located on the upper surface of the substrate;
    a plurality of isolation regions defined on the upper surface of the substrate such that each of the contact pads is separated from the remaining contact pads by at least one of the isolation regions;
    a plurality of electrically conductive legs electrically connected with one or more of the contact pads and depending downward from the substrate for insertion into the printed circuit board; and
    erasable graphite trace means for repeatedly and selectively electrically interconnecting two or more of the contact pads by tracing between the selected contact pads across at least one of said isolation regions, to provide a consistent and sustainable electrical interconnection of the circuit elements associated with the selected contact pads after the switch device has been manufactured, such that the erasable graphite trace means may also be repeatedly and selectively removed from between the selected contact pads to disconnect the circuit elements associated with the selected contact pads to allow the circuit elements to be quickly and easily reprogrammed.

8. The switch device of claim 7 wherein the substrate is ceramic.

9. The switch device of claim 7 wherein the conductive pads are palladium silver.

10. The switch device of claim 7 wherein the conductive pads are silver.

11. The switch device of claim 7 wherein the trace is deposited by a carbon/graphite pencil.

12. The switch device of claim 7 wherein the distance across an isolation region between two contact pads selectively electrically interconnected by the erasable graphite trace is greater than 0.005 mils and less than 0.500 mils and the average resistance between the two contact pads is greater than 50 ohms and less than 1,000 ohms.

13. A surface mount switch device for providing an electrical interconnection among circuit elements on a printed circuit board, comprising:
    a generally rectangular substrate;
    a plurality of electrically conductive contact pads located on the upper surface of the substrate;
    a plurality of isolation regions defined on the upper surface of the substrate such that each of the contact pads is separated from the remaining contact pads by at least one of the isolation regions;
    a plurality of electrically conductive surface mount pads electrically connected with one or more of the contact pads and located on the bottom surface of the substrate for abuttable engagement with the printed circuit board; and
    erasable graphite trace means for repeatedly and selectively electrically interconnecting two or more of the contact pads by tracing between the selected contact pads across at least one of said isolation regions after the switch device has been manufactured, to provide a consistent and sustainable electrical interconnection of the circuit elements associated with the selected contact pads, such that the erasable graphite trace means may also be repeatedly and selectively removed from between the selected contact pads to disconnect the circuit elements associated with the selected contact pads to allow the circuit elements to be quickly and easily reprogrammed.

14. The switch device of claim 13 wherein the substrate is ceramic.

15. The switch device of claim 13 wherein the conductive pads are palladium silver.

16. The switch device of claim 13 wherein the conductive pads are silver.

17. The switch device of claim 13 wherein the trace is deposited by a carbon/graphite pencil.

18. The switch of claim 13 wherein the distance across an isolation region between two contact pads selectively electrically interconnected by the erasable graphite trace is greater than 0.005 mils and less than 0.500 mils and the average resistance between the two contact pads is greater than 50 ohms and less than 1,000 ohms.

19. A method for electrically interconnecting circuit elements on a substrate surface of a printed circuit board, comprising the steps of:
creating a plurality of electrically conductive contact pads located on the substrate surface;
defining a plurality of isolation regions on the substrate surface such that each of the contact pads is separated from the remaining contact pads by at least one of the isolation regions;
electrically connnecting each of the contact pads to one or more of the circuit elements on the printed circuit board; and
selectively electrically interconnecting two or more of the contact pads by tracing an erasable graphite trace between the selected contact pads across at least one of said isolation regions after the printed circuit board has been manufactured, to provide a consistent and sustainable electrical interconnection of the circuit elements associated with the selected contact pads, such that the erasable graphite trace may also be selectively removed from between the selected contact pads to disconnect the circuit elements associated with the selected contact pads to allow the circuit elements to be quickly and easily reprogrammed by repeating the step of selectively electrically interconnecting two or more of the contact pads.

20. The method of claim 19 wherein the substrate surface is ceramic.

21. The method of claim 19 wherein the conductive pads are palladium silver.

22. The method of claim 19 wherein the conductive pads are silver.

23. The method of claim 19 wherein the tracing is accomplished by using a carbon/graphite pencil lead.

24. The method of claim 23 wherein the step of selectively electrically interconnecting two or more contact pads is accomplished by tracing the carbon/graphite pencil in a generally circular manner in the isolation regions.

25. The method of claim 19 wherein the trace is selectively removed by use of an eraser.

26. A method for electrically interconnecting circuit elements on a printed circuit board, comprising the steps of:
providing a generally rectangular substrate;
creating a plurality of electrically conductive contact pads located on the substrate surface;
defining a plurality of isolation regions on the substrate surface such that each of the contact pads is separated from the remaining contact pads by at least one of the isolation regions;
providing a plurality of electrically conductive legs electrically connected with one or more of the contact pads and depending downward from the substrate for insertion into the printed circuit board; and
selectively electrically interconnecting two or more of the contact pads by tracing an erasable graphite trace between the selected contact pads across at least one of said isolation regions after the rectangular substrate has been manufactured, to provide a consistent and sustainable electrical interconnection of the circuit elements associated with the selected contact pads, such that the erasable graphite trace may also be selectively removed from between the selected contact pads to disconnect the circuit elements associated with the selected contact pads to allow the circuit elements to be quickly and easily reprogrammed by repeating the step of selectively electrically interconnecting two or more of the contact pads.

27. The method of claim 26 wherein the substrate surface is ceramic.

28. The method of claim 26 wherein the conductive pads are palladium silver.

29. The method of claim 26 wherein the conductive pads are silver.

30. The method of claim 26 wherein the tracing is accomplished by using a carbon/graphite pencil lead.

31. The method of claim 30 wherein the step of selectively electrically interconnecting two or more contact pads is accomplished by tracing the carbon/graphite pencil in a generally circular manner in the isolation regions.

32. The method of claim 26 wherein the trace is selectively removed by use of an eraser.

33. A method for electrically interconnecting circuit elements on a printed circuit board, comprising the steps of:
providing a generally rectangular substrate;
creating a plurality of electrically conductive contact pads located on the substrate surface;
defining a plurality of isolation regions on the substrate surface such that each of the contact pads is separated from the remaining contact pads by at least one of the isolation regions;
providing a plurality of electrically conductive surface mount pads electrically connected with one or more of the contact pads for abuttable engagement with the printed circuit board; and
selectively electrically interconnecting two or more of the contact pads by tracing an erasable graphite trace between the selected contact pads across at least one of said isolation regions after the rectangular substrate has been manufactured, to provide a consistent and sustainable electrical interconnect of the circuit elements associated with the selected contact pads, such that the erasable graphite trace may also be selectively removed from between the selected contact pads to disconnect the circuit elements associated with the selected contact pads to allow the circuit elements to be quickly and easily reprogrammed by repeating the step of selectively electrically interconnecting two or more of the contact pads.

34. The method of claim 33 wherein the substrate surface is ceramic.

35. The method of claim 33 wherein the conductive pads are palladium silver.

36. The method of claim 33 wherein the conductive pads are silver.

37. The method of claim 33 wherein the tracing is accomplished by using a carbon/graphite pencil lead.

38. The method of claim 37 wherein the step of selectively electrically interconnecting two or more contact pads is accomplished by tracing the carbon/graphite pencil in a generally circular manner in the isolation regions.

39. The method of claim 33 wherein the trace is selectively removed by use of an eraser.

* * * * *